(12) United States Patent
Cook

(10) Patent No.: US 6,286,586 B2
(45) Date of Patent: *Sep. 11, 2001

(54) TORSION BAR CLAMP APPARATUS AND METHOD FOR IMPROVING THERMAL AND MECHANICAL CONTACT BETWEEN STACKED ELECTRONIC COMPONENTS

(75) Inventor: Randolph H. Cook, Gilford, NH (US)

(73) Assignee: Aavid Thermalloy, LLC, Concord, NH (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/449,320

(22) Filed: Nov. 24, 1999

Related U.S. Application Data

(62) Division of application No. 08/864,174, filed on May 28, 1997, now Pat. No. 6,012,510.

(51) Int. Cl.[7] ........................................... F28F 7/00
(52) U.S. Cl. ..................... 165/80.3; 165/185; 257/719; 257/718; 361/704
(58) Field of Search ................... 165/80.3, 185; 257/718, 719, 722, 727; 361/703, 702, 704, 707, 709, 710, 711; 174/16.3

(56) References Cited

U.S. PATENT DOCUMENTS

| Re. 35,573 | 7/1997 | Clemens . | |
|---|---|---|---|
| 4,745,456 | 5/1988 | Clemens . | |
| 5,040,096 | * 8/1991 | Churchill et al. ............... | 165/80.3 X |
| 5,430,610 | 7/1995 | Hung . | |
| 5,464,054 | 11/1995 | Hinshaw et al. . | |
| 5,678,627 | * 10/1997 | Lee .................................. | 165/185 X |
| 5,771,155 | * 6/1998 | Cook .................................. | 257/719 |
| 5,784,257 | * 7/1998 | Tata ................................ | 165/185 X |
| 5,828,550 | * 10/1998 | Horng ............................. | 165/185 X |
| 5,932,925 | * 8/1999 | McIntyre ........................ | 165/185 X |
| 5,979,025 | * 11/1999 | Horng ............................. | 165/80.3 X |

* cited by examiner

Primary Examiner—Christopher Atkinson
(74) Attorney, Agent, or Firm—Cohen, Pontani, Lieberman, Pavane

(57) ABSTRACT

A torsion bar clamp device and method for mounting a heat sink to an electronic component comprising a torsion bar having a longitudinally extending bar and at least one integral lever adapted to engage a heat sink and mounting legs which couple forces imparted by the torsion bar to the heat sink and electronic component such that the heat sink and electronic component are compressively coupled. The invention may be manufactured of injection molded plastic and may be adapted to allow the mounting legs to engage bosses on a socket in which an electronic component is mounted.

12 Claims, 11 Drawing Sheets

TORSION BAR CLAMP APPARATUS AND METHOD FOR IMPROVING THERMAL AND MECHANICAL CONTACT BETWEEN STACKED ELECTRONIC COMPONENTS

This application is a division of Ser. No. 08/864,174 filed May 28, 1997 now U.S. Pat. No. 6,012,510.

FIELD OF THE INVENTION

The present invention relates to the field of mounting heat sinks to circuit components and other devices that generate thermal energy so as to provide assisted cooling to such devices. The invention comprises a torsion bar clamp apparatus and a method for applying a compressive force to stacked electronic components for improving thermal and mechanical contact between a heat dissipating device and a heat generating circuit component.

BACKGROUND OF THE INVENTION

Electronic components on circuit boards, such as, for example, power transistors, processors and the like can generate significant amounts of heat which must be removed in order to ensure reliable component operation. Some of the heat can be, and is dissipated through the components' leads. Much of the excess heat, however, is removed to ambient air. Cooling can be assisted and improved by thermally coupling a finned, pinned or other type of heat sink to the circuit component, thereby increasing the surface area over which heat from the component may be dissipated to ambient air.

In a number of known configurations, a heat sink having fins, pins, or other heat radiating structures is mounted via a releasable leaf spring type spring clip to an upper surface of a circuit component. The circuit component usually is releasably mounted in a socket which is in turn attached to a circuit board. The known spring clip may attach to bosses projecting from opposite peripheral sides of the component or of the socket in which the component is mounted. A portion of the clip crossing over the heat sink bears down on the top of the heat sink, applying a compressive force to retain the heat sink in intimate stacked relation to the heat generating components.

A common problem with such prior art clamping methods is that the high forces required to install or remove the clips often result in the circuit board being damaged during installation and/or removal of the clips. Two "failure" mechanisms resulting from installation or removal-related damage are understood. First, the ends of the clips can contact and damage conductor traces on the surface of the circuit board during installation or removal. Second, some clips require tools for installation and/or removal, and the tools may either flex or strike the circuit board or other components, causing damage. This second form of damage is especially likely to occur if the tool is misused, or if an improper substitute tool is used. Additionally, the need for any type of tool for installation or removal of a clip is seen as an unfavorable alternative in the industry, regardless of the risk of board damage.

In addition, prior art clamping systems have typically been made of metal, which creates the danger of shorting circuit boards or components mounted thereon should the clip become disengaged from the devices to which they are clamped. This potential for circuit board damage and failure has led many in the industry to avoid using labor saving clamps in favor of more labor intensive but safer methods of mechanical fastening, such as screws, bolts and the like.

As a result of the disadvantages present in the prior art, there is a need for a device and method for thermally and mechanically coupling a heat sink to an electronic component or other device needing cooling which poses less risk of damage to a circuit board during installation, does not require tools to install or remove, and will not short out a circuit board or adjacent components should the clip become dislodged during installation or use.

SUMMARY OF THE INVENTION

The clamping device of the present invention provides a compressive force to stacked components without the potential for damaging a printed circuit board and without the need for tools to accomplish installation and removal. In addition, the invention may be manufactured using non-conductive plastic, eliminating the possibility of shorting expensive circuit boards and/or other components in the unlikely event that the clamp becomes dislodged during use.

The clamping device includes a torsion bar having at least one lever and mounting means for securing the torsion bar in operative position above a heat sink stacked atop a heat generating circuit component. When installed, the torsion bar is stressed causing the lever to impart a force to the heat sink and the mounting means to impart an opposing force to the component or other surface to which the clamping device may be mounted, thus causing the stacked heat sink and component to be clamped together. These torsion bar/lever and mounting means can be manufactured separately and later joined, or they can be manufactured as a single, unitary, device, as a matter of design choice.

In the preferred embodiment of the invention, the torsion bar and mounting means are injection molded as a single piece made preferably of an essentially non-conductive plastic. The torsion bar comprises two integral, outwardly projecting levers, each extending in a different direction and biased toward the device to be clamped such that pressing the levers against the device causes rotational stress on the torsion bar. The torsion bar is frangibly attached to two mounting legs located at the ends of the bar.

The mounting legs include structures that attach to corresponding structures forming a part of either the component to be cooled or of a mounting socket in which the component is mounted or of the circuit board. In use, the clamp is aligned atop a heat sink such that the ends of the levers contact the surface of the heat sink and the structures on the mounting legs will engage the corresponding structures of the component or socket when a downward force is applied to the clamp. As downward force is then applied to the clamp, the levers engage the heat sink and stress the torsion bar by causing it to rotate in opposite directions. As continued pressure is applied the torsion bar is stressed to such a point that the bar rotates and breaks the frangible attachment between bar and mounting legs. Finally, the mounting legs engage bosses or other structures on the device or socket and are retained in place, installation thus being completed. When installed the torsion bar is held in a state of rotational stress by the oppositely applied pressure of the levers against the heat sink. This stress imparts a corresponding downward force to the top of the heat sink base and an opposing upward force to the mounting legs where the mounting legs engage the component or socket, effectively clamping the heat sink and component together.

In another embodiment of the invention, the torsion bar and mounting legs are injection molded separately and assembled together such that the separate parts operate in the same manner as the preferred embodiment.

In another embodiment of the invention, the torsion bar and mounting legs are injection molded separately, and the mounting legs include mounting slots along a top edge for snap fit mounting of the torsion bar therein. The legs are joined by a separate cross member, thus forming a mounting bracket assembly that may be attached to the component or socket prior to installing the torsion bar or the heat sink. In this embodiment, the mounting bracket is first installed on the component or socket, and then the heat sink is positioned atop the component. The torsion bar is positioned above the heat sink and aligned with the top mounting slots. A downward force is then applied to the torsion bar causing it to engage the base of the heat sink and snap into the top mounting slots which hold the bar in place.

In still another embodiment, the torsion bar is molded with a single lever and the ends of the bar are permanently attached to the mounting legs. In this embodiment, the bar is located at one edge of the heat sink and the end of the lever contacts a central region of the heat sink when installed.

In all embodiments of the present invention, the geometric and structural design constraints of the torsion bar are largely divorced from those of the mounting legs. The invention is therefore highly adaptable to variations in the geometric configurations of the parts being clamped as well as to variations in clamping force requirements. A change to the size or shape of the parts being clamped can be accommodated by a relatively simple change to the mounting legs without necessarily requiring a design change to the torsion bar. Conversely, if a change to the clamping force is required, this can be accomplished without necessarily requiring a design change to the mounting legs. Thus, the designer has the freedom to change either the torsion bar or the mounting legs without compromising the other.

In addition to its design flexibility, the clamping device of the present invention has a number of other advantages over prior art devices for coupling heat sinks to electronic components. The clamp is adapted to be safely and easily installed and removed without the use of separate tools, and the arrangement of the mounting legs and levers prevents the mounting legs form contacting and damaging printed circuit boards. Further, the preferred use of non-conductive plastic eliminates the risk of shorting printed circuit boards or other components during installation or removal.

Other objects and features of the present invention will become apparent from the following detailed description considered in conjunction with the accompanying drawings. It is to be understood, however, that the drawings are designed solely for the purposes of illustration and not as a definition of the limits of the invention, for which reference should be made to the appended claims.

DESCRIPTION OF THE DRAWING FIGURES

In the drawings, which are illustrative and not to scale, and wherein like reference characters denote similar elements throughout the several views:

FIG. 11a is a perspective view of another embodiment of the torsion bar clamp of FIG. 1;

FIG. 11b is a perspective view depicting an alternate feature of the embodiment of the torsion bar clamp of FIG. 11a;

FIG. 15 is a top plan view of the embodiment of FIG. 14a.

DETAILED DESCRIPTION OF THE PRESENTLY PREFERRED EMBODIMENTS

Figure 1:
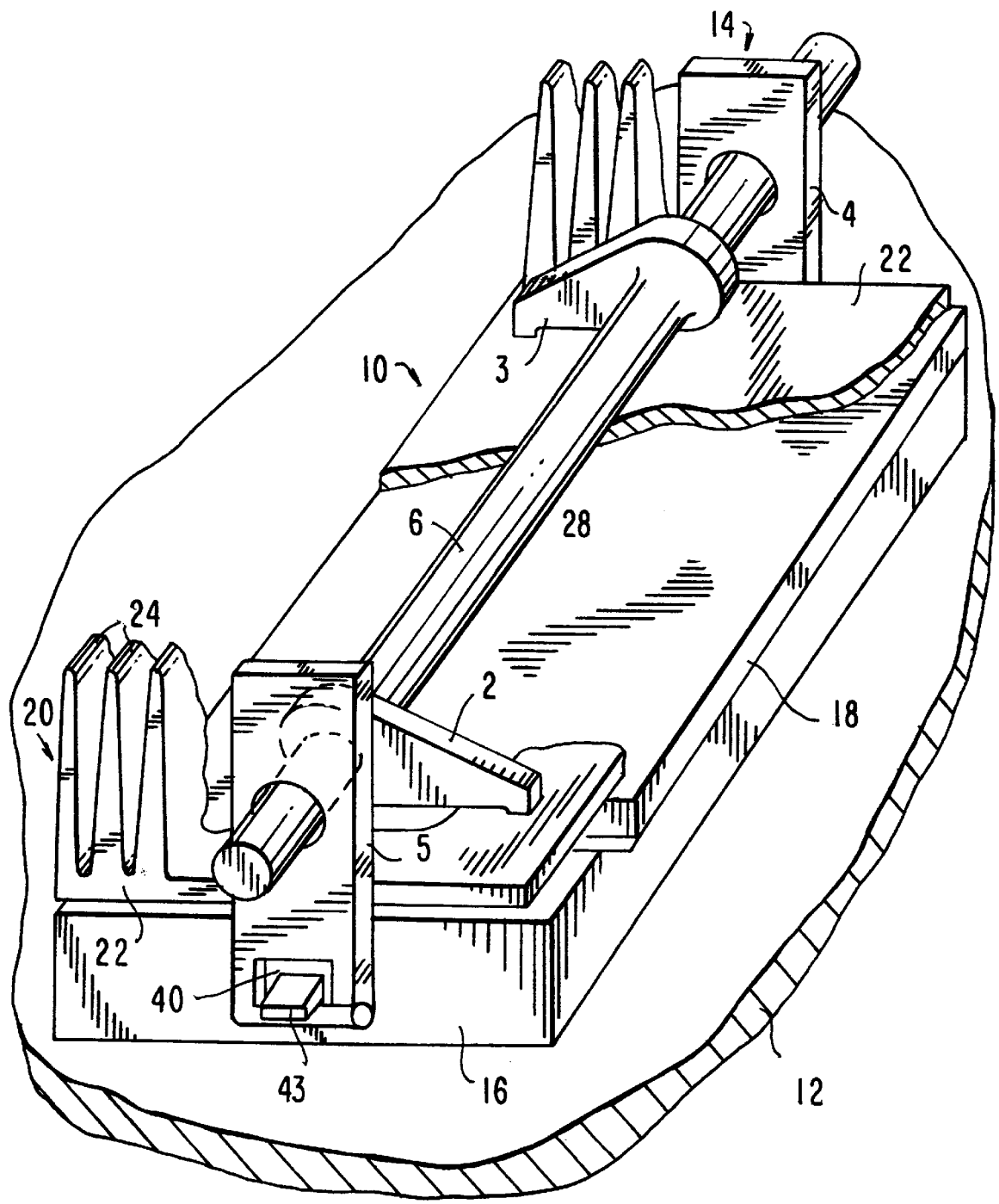
FIG. 1 is a diagrammatic perspective view of the heat dissipating assembly according to the invention, partially broken away to reveal a torsion bar clamp device.

With initial reference to FIG. 1, a preferred embodiment of a heat dissipating assembly 10 is depicted mounted on a circuit board 12 and includes a stack of components held together with a torsion bar clamp device 14. The bottom component of the stack is a socket 16 mounted directly to circuit board 12 for receiving heat generating electrical or electronic components, such as processor chips, power transistors, integrated circuit (IC) packages and the like, or any other heat generating component or device requiring assisted heat dissipation. As used herein the term component package is defined in non-limiting fashion to include any heat generating device or electrical or electronic component.

Disposed in the stack is a component package 18 mounted in socket 16. Socket 16 is equipped with bosses 43 on opposing sides of socket 16, only one boss 43 being visible in FIG. 1. Positioned at the top of the stack is a heat sink 20 for placement on top of component package 18 for dissipating heat therefrom. Heat sink 20 has an essentially flat base 22 placed in contact with component package 18 and fins 24 extending upward from base 22, in a configuration well known in the art. Of course it will be recognized that other types of heat sinks having pins or other heat dissipating protuberances or structures may also be used, as a matter of design choice, the exact heat sink configuration not being critical to the instant invention.

Torsion bar clamp 14 is comprised of two major components, a torsion bar 28 comprised of an elongate, elastically deformable bar 6 having radially extending levers 2 and 3, and mounting means comprised of mounting legs 4 and 5. Bar 6 is preferably cylindrical, but may have any cross sectional shape as a matter of design choice. Mounting legs 4, 5 each have apertures 40 formed therein. The apertures 40 are predeterminately configured so as to releasably matingly engage bosses 43 of socket 16 when the torsion bar clamp device 14 is operatively clamped to a component stack.

Torsion bar clamp device 14 may be integrally formed as a one piece, injection molded structure, or the subcomponents thereof may be formed or molded separately to constitute an assembly as a matter of design choice. In a presently preferred embodiment, depicted in FIGS. 5a and 5b and discussed further herein, device 14 is molded as a unitary structure comprising a frangible connection between torsion bar 28 and mounting legs 4, 5, such that bar 6 will separate from and rotate relative to mounting legs 4, 5 when sufficient stress is applied to bar 6.

Preferably, clamping device 14 is made of an essentially non-conductive, elastically deformable plastic material, such as, for example, 900 series LEXAN polycarbonate manufactured by General Electric Plastic Group, Pittsfield, Mass. As used herein the terms essentially non-conductive or non-conductive are used interchangeably to mean any material with relatively low or no electrical conductance properties, such that a device formed therefrom will pose no short circuit risk to electrical circuit components proximate the device. The actual required conductivity value of the non-conductive or essentially non-conductive material is an application-specific matter of design choice depending upon, among other things, the sensitivity of the circuitry surrounding the device.

Figure 2:
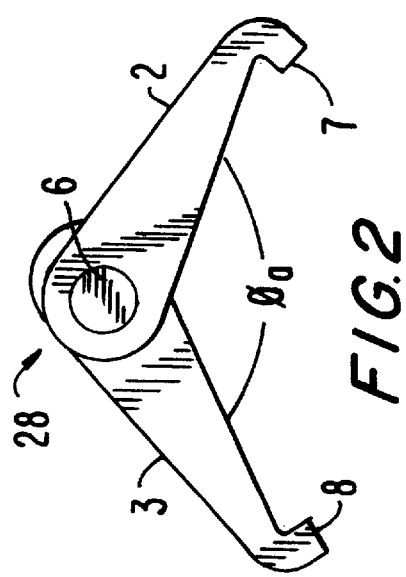
FIG. 2 is an end view of the torsion bar of the torsion bar clamp device of FIG. 1 in a free and relaxed state.

Referring now to FIGS. 1 and 2, an end view of torsion bar 28 is shown in a free and unstressed state. Levers 2, 3 include feet 7, 8 which engage heat sink base 22. Levers 2, 3 are preferably integral to, but may be formed separately from and affixed to bar 6, for radial extension outward from and perpendicular to the longitudinal axis of bar 6. In a free and unstressed state, levers 2, 3 are angled downward towards the stack of components such that an angle $\phi_a$ is formed between levers 2, 3. The free state angle $\phi_a$, required to produce the desired clamping force in the deflected state at a given lever length is dependent upon the torsion bar geometry, material properties and clamping force requirements, and is thus a matter of design choice well within the skill of the routineer in the art based upon the particular application requirements encountered. $\phi_a$ is generally dependent upon the shear modulus of the material selected which, in the case of typical plastics for example, reduces over time when the material is subjected to continuous stress at elevated ambient temperature. When, as described above, the clamping device 14 is made of an essentially non-conductive polycarbonate material, such as, for example, 900 series LEXAN polycarbonate, it is assumed that the shear modulus will reduce in operation to approximately one half of its initial value. The selection of $\phi_a$ a should thus generally be made based upon a reduced value of shear modulus—sometimes referred to in the industry as the apparent modulus—so as to yield a clamping force which at initial installation is greater than the ultimately desired clamping force, but which will nonetheless creep to the desired clamping force level over time. $\phi_a$, is preferably approximately one hundred degrees (100°) but will vary depending on bar geometry, material selection and force requirements.

In use, the clamp device 14 is aligned atop a heat sink 20 such that the feet 7, 8 of the levers 2, 3 will contact the heat sink base 22 and the apertures 40 on the mounting legs 4, 5 will align with the bosses 43 of the socket 16. As downward force is applied to the clamp device 14, the levers 2, 3 engage and slide along the heat sink base 22 and stress the torsion bar 6 by virtue of the levers' forced rotation in opposite directions. Continued downward pressure causes mounting legs 4, 5 to flex outwardly from the socket 16 to permit the legs to pass around the bosses 43 until the bosses 43 on socket 16 extend through apertures 40, whereupon mating engagement is achieved between bosses 43 and legs 4, 5 at an interior edge of aperture 40. Alternately, or concurrently, bosses 43 may be designed to flex to achieve mating engagement with legs 4, 5 through apertures 40.

In the installed state, torsion bar 6 is held in a state of rotational stress by the pressure of the levers 2, 3 against the heat sink base 22. This stress imparts a downward force to the top of the heat sink base 22 and an opposing upward force to the mounting legs 4, 5 where an interior edge surface of the aperture 40 of mounting legs engages the bosses 43, effectively clamping the heat sink 20 and the component package 18 together. It will be recognized that bosses 43 may be formed on either the socket 16 or on component package 18, or elsewhere proximate the mounting point, as a matter of design choice. Additionally, the interior edge surface of aperture 40 may be shaped to mate with a correspondingly shaped surface of boss 43, such as a rounded groove on boss 43 fitting around a rounded aperture edge of aperture 40, as shown. Other mating shapes will be readily apparent to one skilled in the art.

Figure 4:
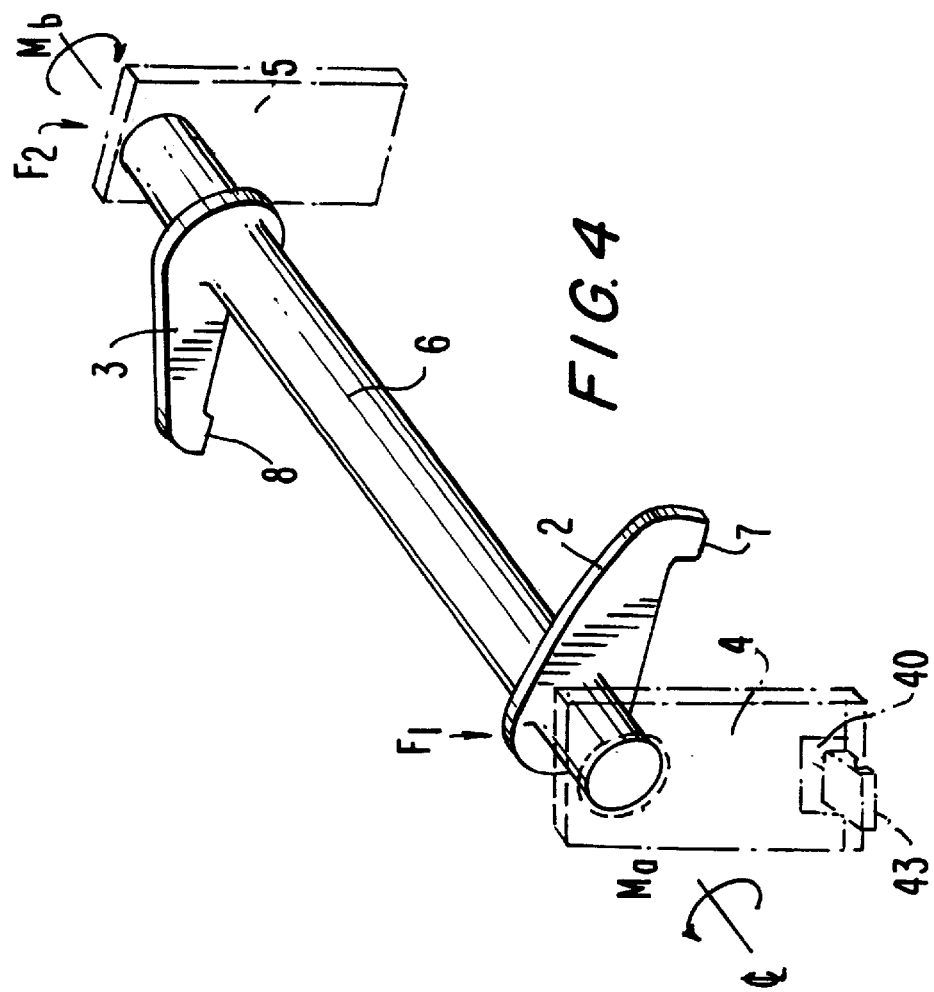
FIG. 4 is an isometric view of the torsion bar of FIG. 1 in an engaged and stressed state.
Figure 3:
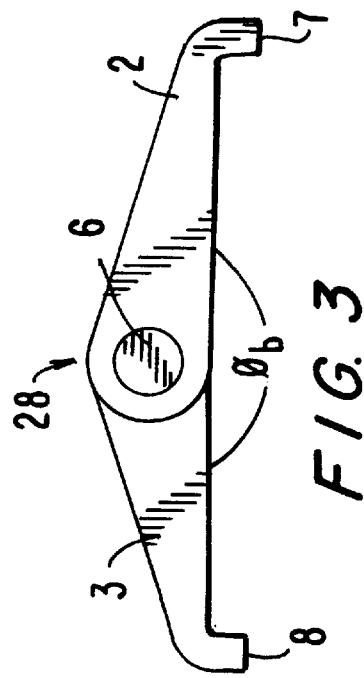
FIG. 3 is an end view of the torsion bar of the torsion bar clamp device of FIG. 1 in an engaged and stressed state.

FIGS. 3 and 4 depict different views of the torsion bar 28 in an engaged and stressed state. As seen in FIG. 3, when feet 7, 8 engage the heat sink base 22 and stress bar 6, the angle between levers 2 and 3, i.e. $\phi_b$, is approximately one hundred and eighty degrees (180°). FIG. 4 shows an isometric view of torsion bar 28 depicting exemplary forces and moments when the clamping device 14 is in an engaged and stressed state. Downward forces F1 and F2, exerted on bar 6 by virtue of its retention by legs 4, 5, are translated through levers 2, 3 to feet 7, 8 which contact heat sink base 22 (not shown). Bar 6 is subjected to oppositely directed moments Ma and Mb which are respectively equal to F1 and F2 times the length or extension of levers 2, 3 measured from the centerline CL of bar 6.

Figure 5A:
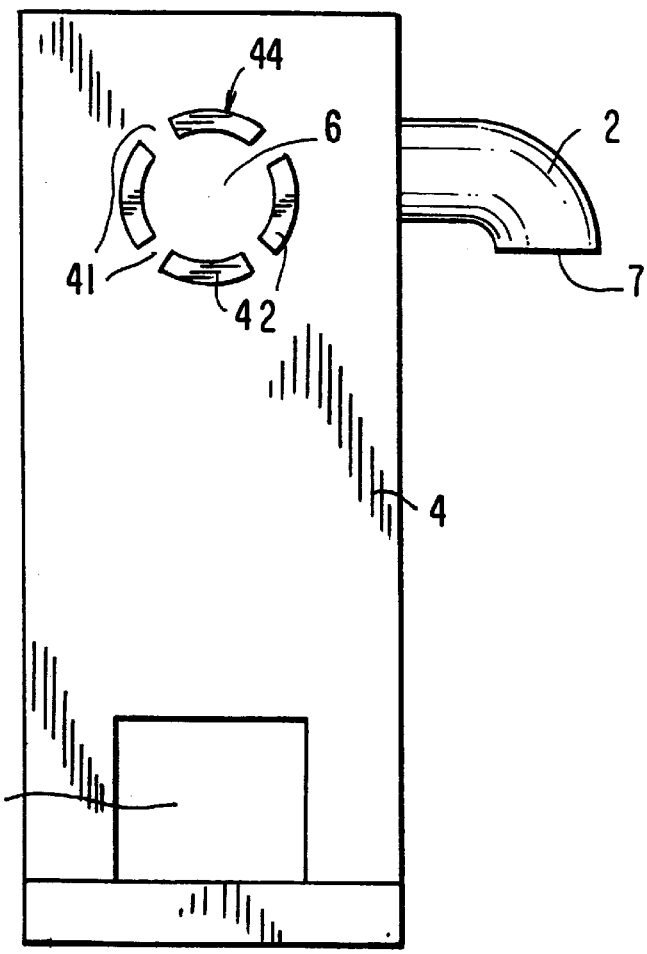
FIG. 5a is an end view of a mounting leg of the torsion bar clamp device of FIG. 1.

Referring now to FIG. 5a, an end view of a modified form of the torsion bar clamp 14 depicts a frangible structure permitting clamp 14 to be formed, preferably by injection molding or like technique, as a unitary device configured to enable the breakaway feature described above. While only one mounting leg is described and depicted, it will be understood that the structure is the same for both mounting legs 4 and 5 and both ends of bar 6.

Figure 5B:
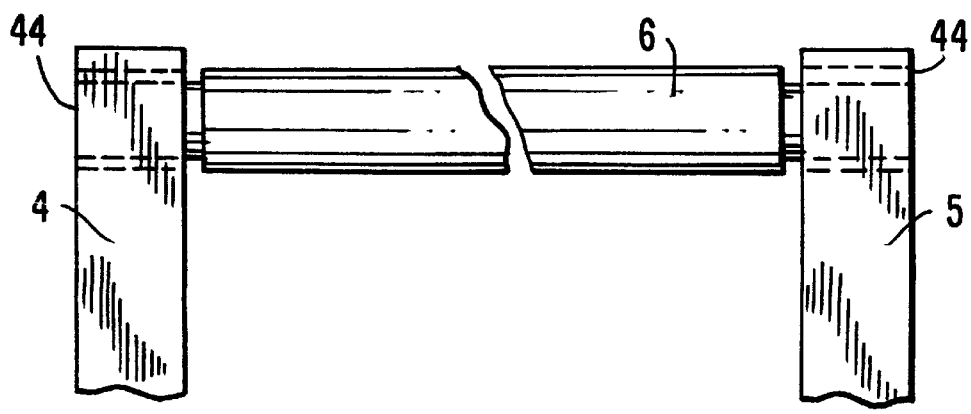
FIG. 5b is a front view of the torsion bar depicting an alternate feature of said bar.

Mounting leg 4 is formed integrally attached to bar 6 by frangible retaining spokes 41 which, in conjunction with cavities 42, define a breaking circle 44. During the continued downward pressure applied during installation and the resultant stressing of the torsion bar 6, sufficient torque is generated by bar 6 to cause it to rotate within breaking circle 44 and break the frangible retaining spokes 41, thereby severing the attachment between bar 6 and mounting leg 4 and allowing bar 6 to rotate freely relative to leg 4. Optionally, as depicted in FIG. 5b, the body of torsion bar 6 extending between mounting legs 4, 5 may have a diameter larger than the diameter of the breaking circle 44 to limit movement of bar 6 along its longitudinal axis between mounting legs 4, 5.

Figure 6:
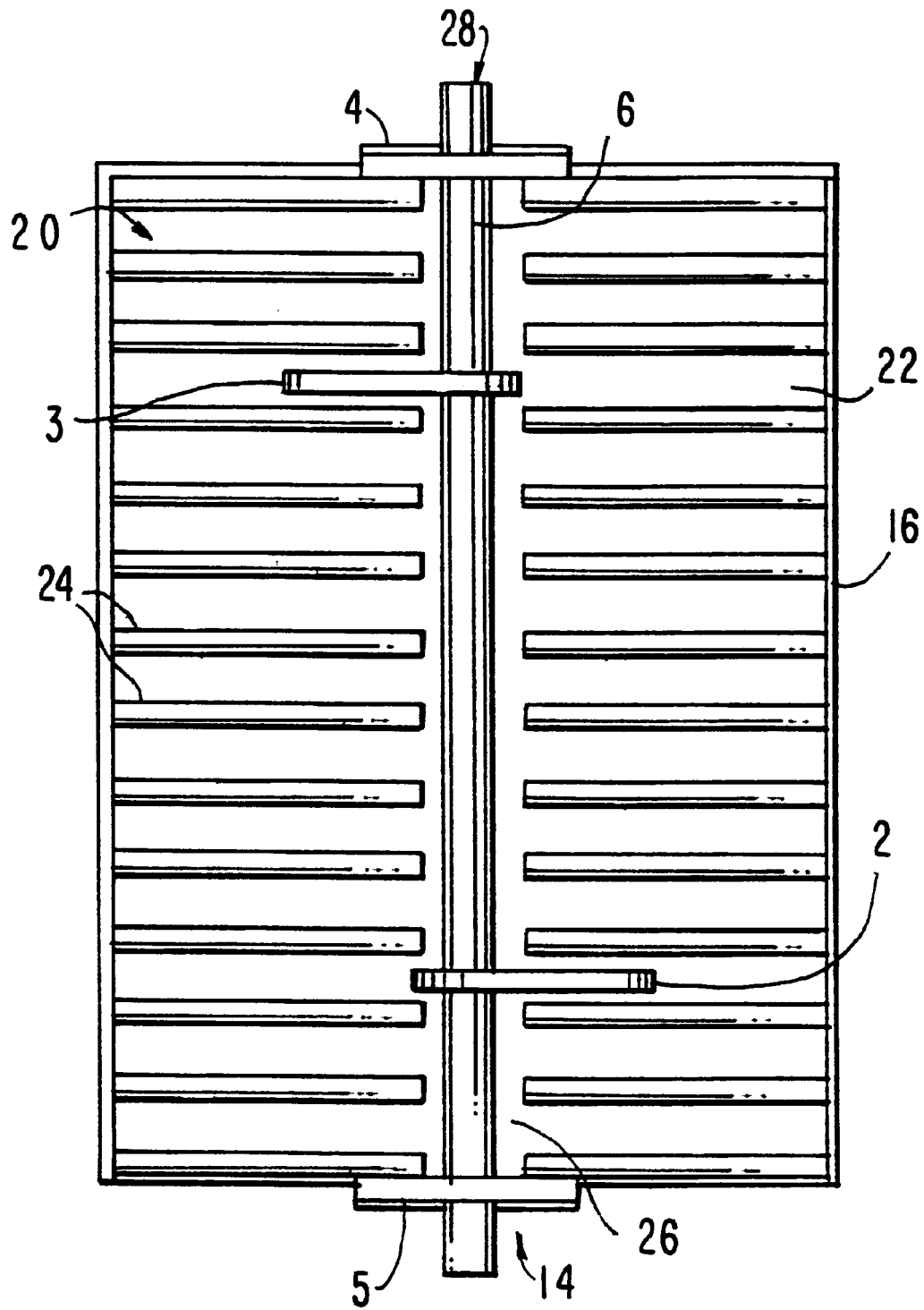
FIG. 6 is a top plan view of the assembly of FIG. 1.

Referring now to FIG. 6, a top plan view of the embodiment of FIG. 1 is shown. Torsion bar clamp 14 is operatively mounted on top of base 22 of heat sink 20 such that mounting legs 4, 5 are engaged with bosses 43 (not shown) of socket 16. In a preferred embodiment, bar 6 of torsion bar 28 extends within a channel 26 formed between sections of fins 24 of heat sink 20 and levers 2, 3 extend between fins 24 such that feet 7, 8 (not shown) engage heat sink base 22. However, similar results can be achieved by reorienting torsion bar 28 such that bar 6 extends between fins 24 and levers 2, 3 extend between channels formed by removing or relocating sections of fins 24, or by locating levers 2, 3 outboard from of the heat sink fins such that feet 7, 8 bear on a peripheral lip of heat sink base 22. These and other modification of the configurations of the present invention described herein will be readily apparent to those skilled in the art.

As evident from the description above, positioning and clamping torsion bar clamp 14 to the stacked components can be readily accomplished without tools. Socket 16 is attached to circuit board 12, component package 18 is mounted in socket 16, and heat sink 20 is placed atop component package 18 in a conventional manner. Torsion bar clamp 14 is then oriented atop heat sink 20 such that feet 7, 8 of levers 2, 3 contact the top of base 22 of heat sink 20. In this condition the torsion bar 28 is in a free and unstressed state and supports only its weight and the weight of the mounting legs 4, 5. A downward force is then applied to mounting legs 4, 5 causing levers 2, 3 to rotate in opposite directions relative to each other and imparting torque and corresponding twisting movement to bar 6. Continued application of downward force causes apertures 40 of mounting legs 4, 5 to engage with bosses 43 of socket 16 such that torsion bar 28 is held in a deflected state. The downward reaction of feet 7, 8 of levers 2, 3 balanced by the upward reaction on bosses 43 by mounting legs 4, 5 results in the desired compression between the heat sink 20 and component package 18, thereby achieving sound mechanical mating while promoting good heat flow and low thermal impedance therebetween.

Torsion bar clamp 14 may be removed by applying a downward and outward force to one mounting leg 4 (or 5) such that boss 43 disengages from the mounting leg through aperture 40.

Figure 7:
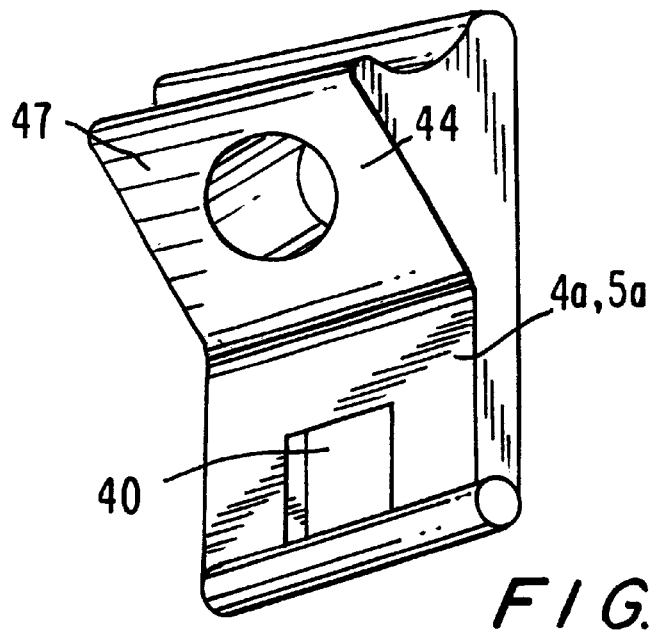
FIG. 7 is a perspective view of another embodiment of the mounting leg of the assembly of FIG. 1.

Referring now to FIG. 7, an alternative embodiment of the mounting legs is shown, further comprising thumb tabs 47 formed proximate the tops of mounting legs 4a, 5a to provide increased stability and ease of installation. In operation, end users installing the clamp device would employ their thumbs to exert the necessary downward forces on thumb tabs 47 to cause mounting legs 4a, 5a to move downward and secure torsion bar clamp 14 in place in the manner described above. A thumb tab 47 of a specific shape is shown in FIG. 7, but other possible shapes, sizes and arrangements of legs 4a, 5a and tab 47 will be apparent to those skilled in the art depending on the specific requirements of the application to which the torsion bar clamp 14 is applied.

Figure 8:
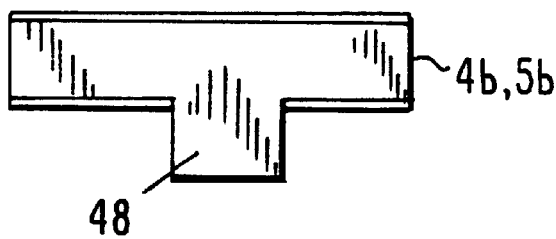
FIG. 8 is a top plan view of another embodiment of the mounting leg of the torsion bar device of FIG. 1.
Figure 9:
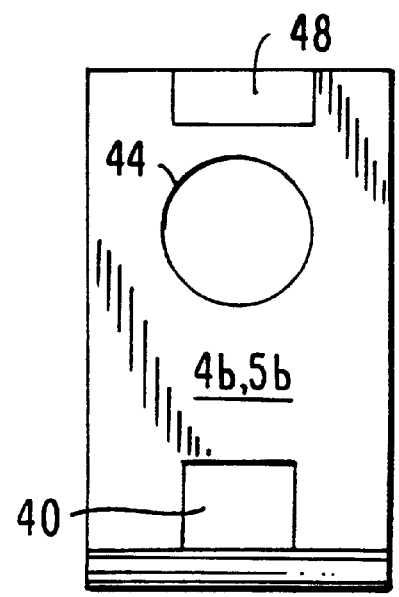
FIG. 9 is an end plan view of the mounting leg of FIG. 8.
Figure 10:
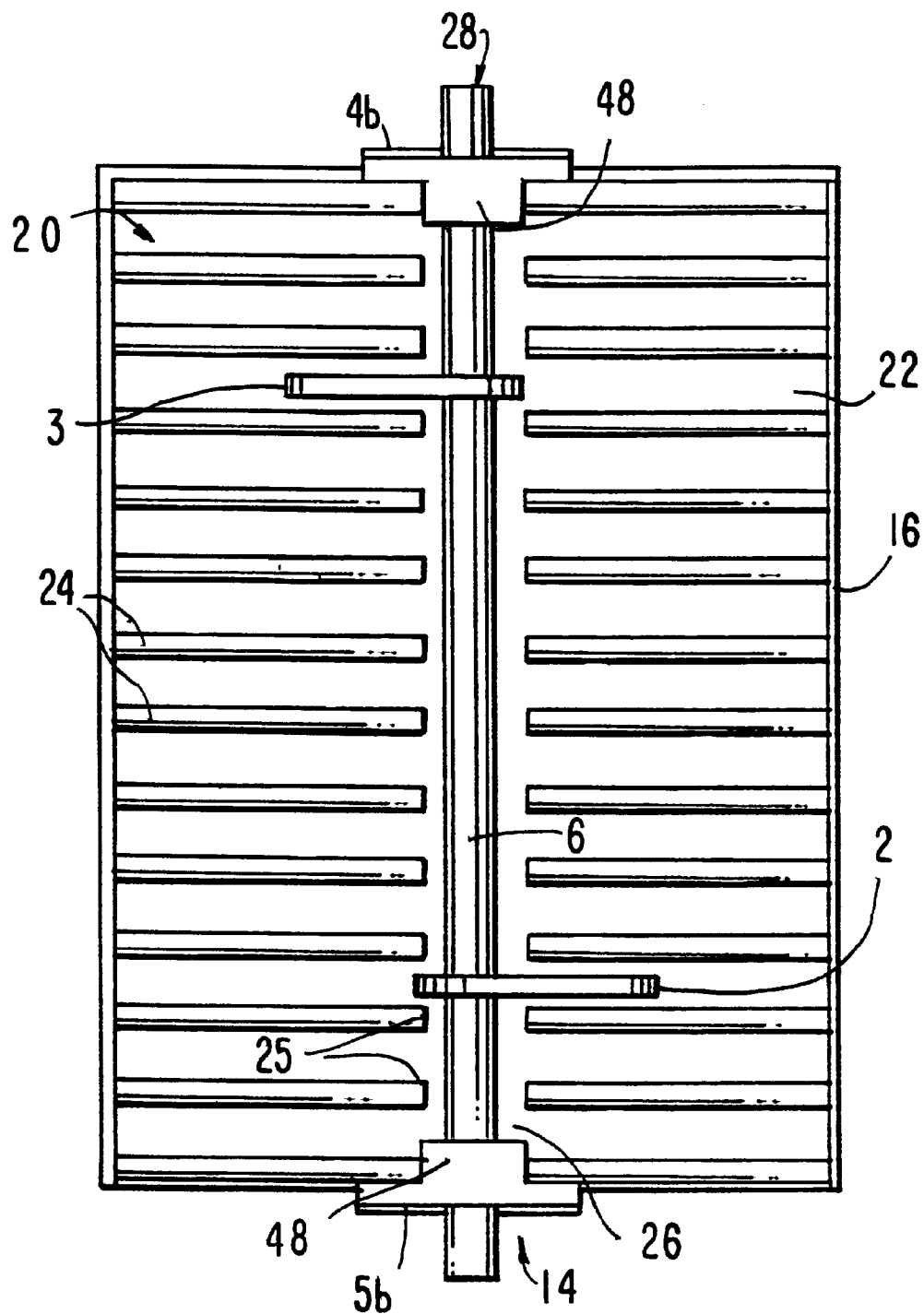
FIG. 10 is a top plan view of another embodiment of the assembly of FIG. 1 including the mounting legs of FIGS. 8 and 9.

Referring now to FIGS. 8, 9 and 10, another embodiment of the mounting legs is shown, further comprising a guide 48 formed at the tops of mounting legs 4b, 5b and adapted to engage fins 24 by being closely fitted thereto. Guide 48 slides between adjacent fins 24 during installation such that mounting legs 4b, 5b are prevented from rotating out of position, such as, for example, before the frangible tabs of the breaking circle 44 have severed, or if bar 6 is configured in fixed relation to the mounting legs with no frangible element provided. In FIG. 10, guide 48 has a rectangular profile which extends into channel 26 and engages fins 24 at tips 25 thereof, but other possible guide configurations are contemplated, such as, for example, U-shaped guides to engage a single fin, or guides which extend to contact more than two fins or fit in more than one channel, or which engage pins or other structures on said heat sink, as a matter of design choice.

Figure 11:
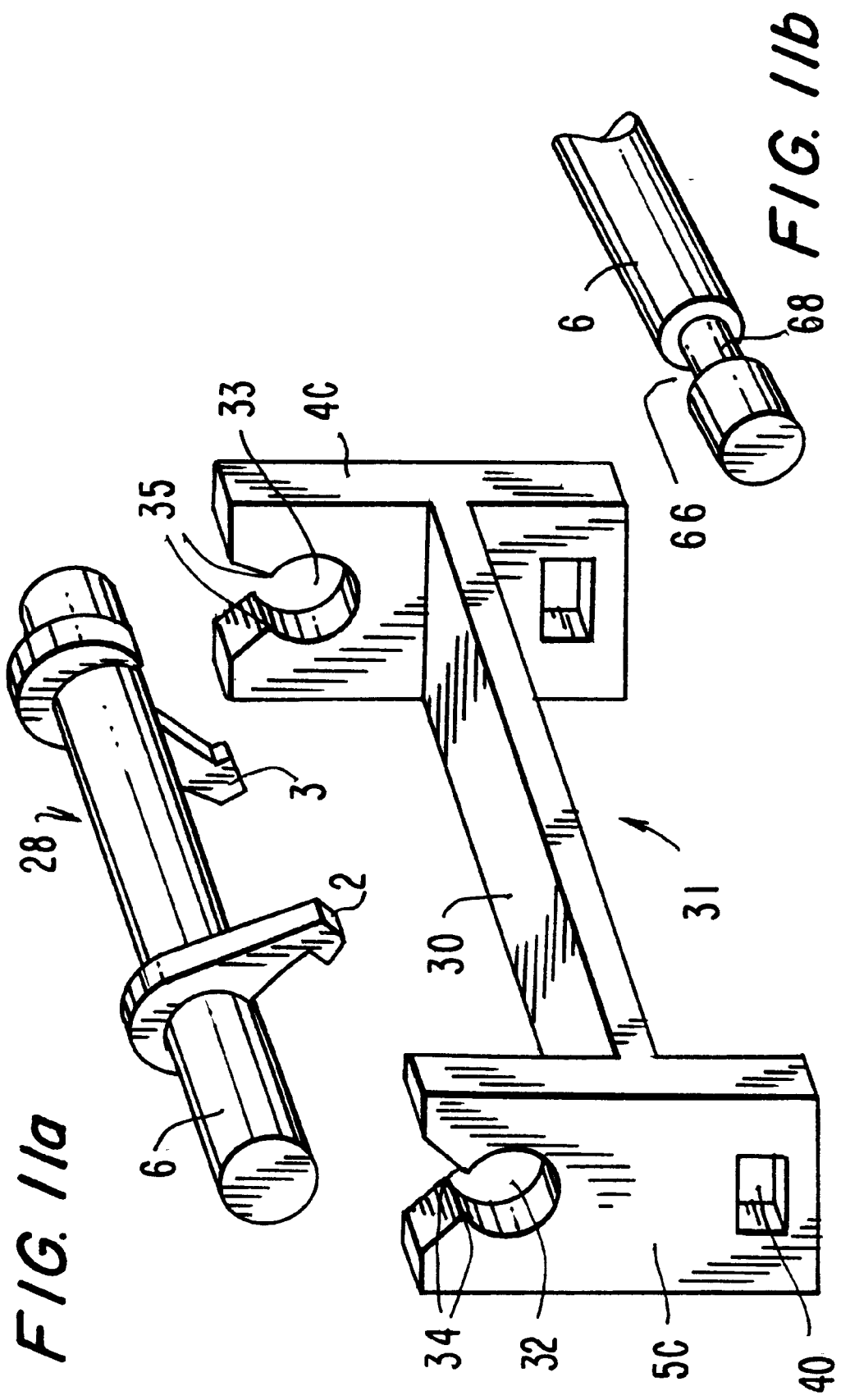
Figure 12:
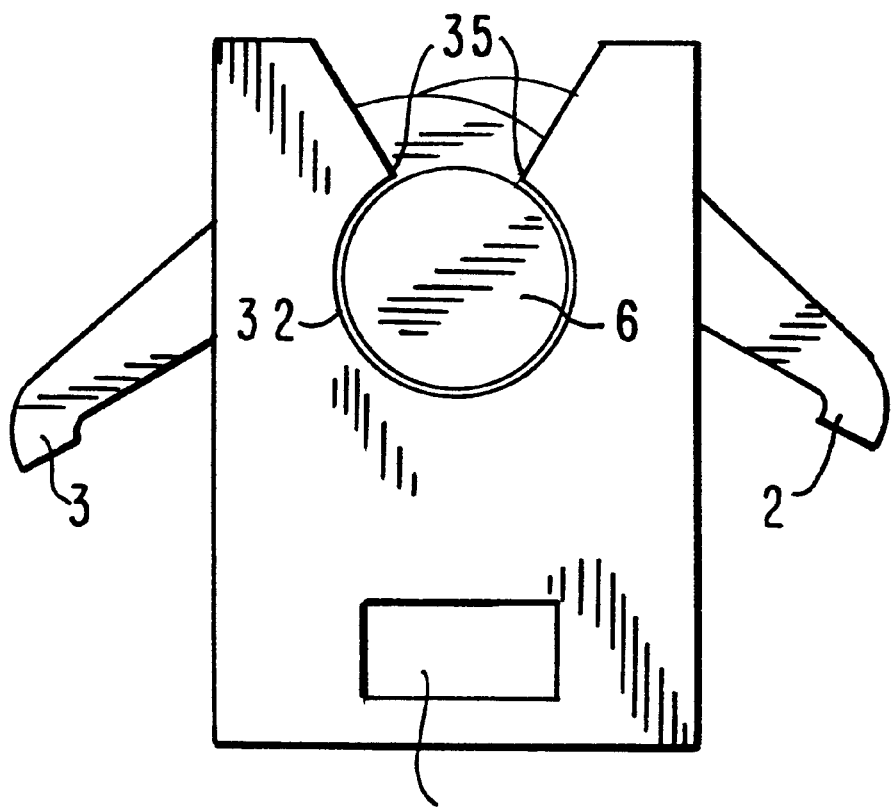
FIG. 12 is an end plan view of the torsion bar clamp of FIG. 11.

Referring now to FIGS. 11a and 12, another embodiment of the invention is shown in which mounting legs 4c, 5c are joined by a beam on a cross member 30, forming a bracket 31 such that it may be attached to the component package 18, socket 16 or circuit board 12 prior to installing torsion bar 28. In this embodiment, the torsion bar 28 and bracket 31 are injection molded separately and mounting legs 4c, 5c includes slots 32, 33 having lips 34, 35 which removably retain bar 6 in place after installation. Slots 32, 33 and lips 34, 35 are configured so that bar 6 snap fits into place for retention and free rotation within slots 32, 33. In operative use bracket 31 is first installed on component package 18 or socket 16 such that it is held in place by engagement of boss 43 with respective mounting legs 4c, 5c through aperture 40. Alternatively, bracket 31 may be formed as as integral portion of the socket 16, or component package 18, or circuit board 12. Cross member 30 may thus optionally be eliminated.

Heat sink 20 (not shown) is then positioned atop component package 18. Torsion bar 28 is then positioned above slots 32, 33 and a downward force is applied to torsion bar 28 such that levers 2, 3 engage base 22 of heat sink 20 (not shown). Bar 6 snaps into slots 32, 33 within which bar 6 is held in place by lips 34, 35. As seen in FIG. 11b, bar 6 may be configured with a groove 66 at one or both ends of bar 6 such that slots 32, 33 and lips 34, 35 snap fit and retain bar 6 via engagement with the reduced diameter portion 68 of bar 6 within groove 66. In this way, linear movement of bar 6 between mounting legs 4c, 5c is restrained.

Figure 13:
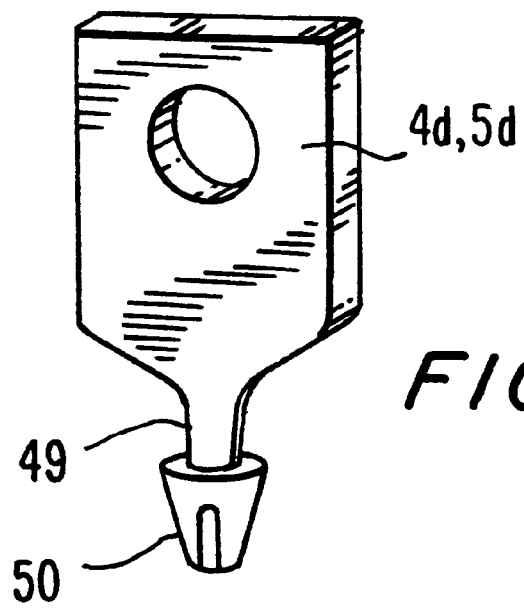
FIG. 13 is a perspective view of another embodiment of the mounting leg of the torsion clamp of FIG. 1.

Referring now to FIG. 13, still another embodiment of mounting legs is shown in which the ends of mounting legs 4d, 5d comprise pins adapted to pass through an aperture or sleeve (not shown) in circuit board 12 or socket 16 to secure torsion bar clamp 14 to component package 18. In FIG. 13, mounting legs 4d, 5d are similar to those described in FIG. 1 except apertures 40 are replaced by substantially cylindrical pins 49 having conical ends 50 which are adapted to allow conical ends 50 to pass through a hole in circuit board 12 (not shown) when a downward force is applied, but to retain mounting legs 4d, 5d when an upward force is applied. Of course the bottom of the mounting legs may be formed in any size and shape adapted to fit any size hole or aperture in, or surface characteristic of the circuit board, as a matter of design choice, and thus the mounting legs may be attached by means other than press fitting, such as by screwing, gluing, soldering or the like.

Figure 14A:
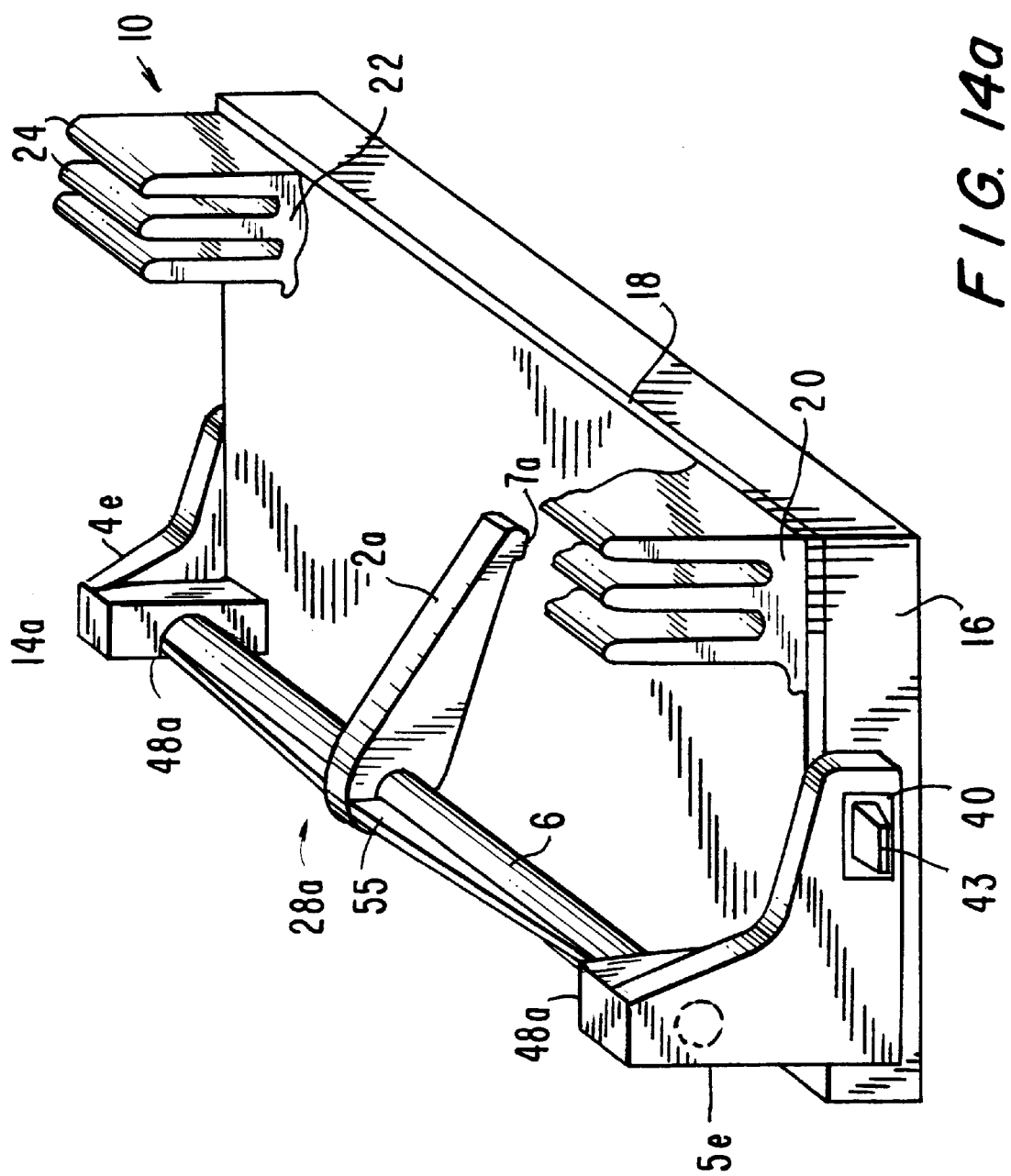
FIG. 14a is an isometric view of another embodiment.
Figure 15:
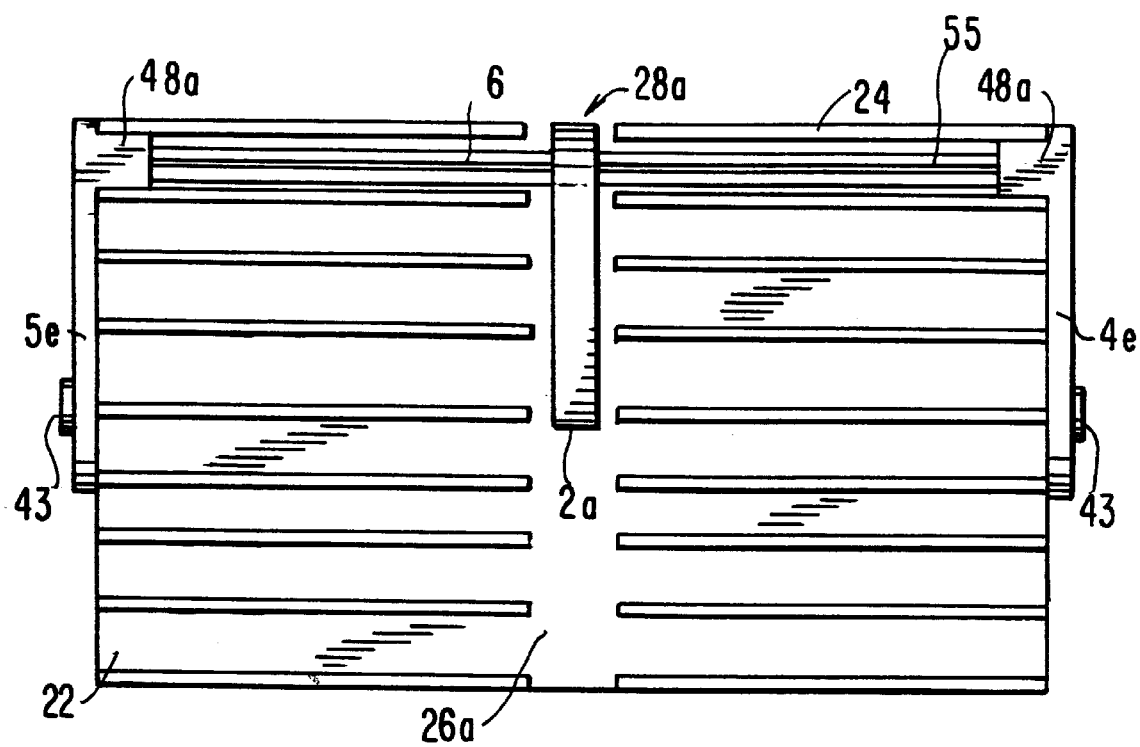

Referring now to FIGS. 14a and 15, still another embodiment of the invention utilizing a single lever 2a is shown. FIG. 14a is an isometric view of the heat dissipating assembly 10 broken away to show torsion bar clamp 14a. Torsion bar clamp 14a is comprised of two components, a torsion bar 28a having a substantially cylindrical bar 6 and lever 2a, and mounting means which, in this embodiment, are mounting legs 4e, 5e. Mounting legs 4e, 5e are formed integral to torsion bar 28 with no frangible connection such that bar 6 cannot rotate relative to mounting legs 4e, 5e when torsion bar clamp 14a is installed. Mounting legs 4e, 5e further comprise apertures 40 adapted to engage bosses 43 of socket 16 and guides 48a adapted to prevent mounting legs 4e, 5e from rotating out of position during installation. Of course such guides, as discussed above, may me adapted to slidably fit between, over or around any appropriate physical feature on said heat sink, be it a fin, pin, rod or other structure on the heat sink. In this embodiment, lever 2a is located substantially at the center of the span between mounting legs 4e, 5e. By centrally locating lever 2a, the potential exists for unwanted transverse upward bending of the bar if the bar is not sufficiently resistant to such bending. If needed, an additional structural element, formed either as part of the bar 6 or mounted to or formed between mounting legs 4e, 5e, may be added to mitigate transverse bending of the bar 6. Of course, such an element should be configured so as permit the rotational angular deflection of bar 6 necessary to create the stresses necessary to apply downward force to lever 2a. Referring once again to FIGS. 14a and 15, this deflection prevention element takes the form of a rib 55 longitudinally formed along the outer surface of bar 6 and shaped so as to stiffen bar 6. The thickness of rib 55 varies along the length of the rib, from a thinnest point proximate the mounting legs 4e, 5e to a thickest point proximate the lever 2a.

Figure 14B:
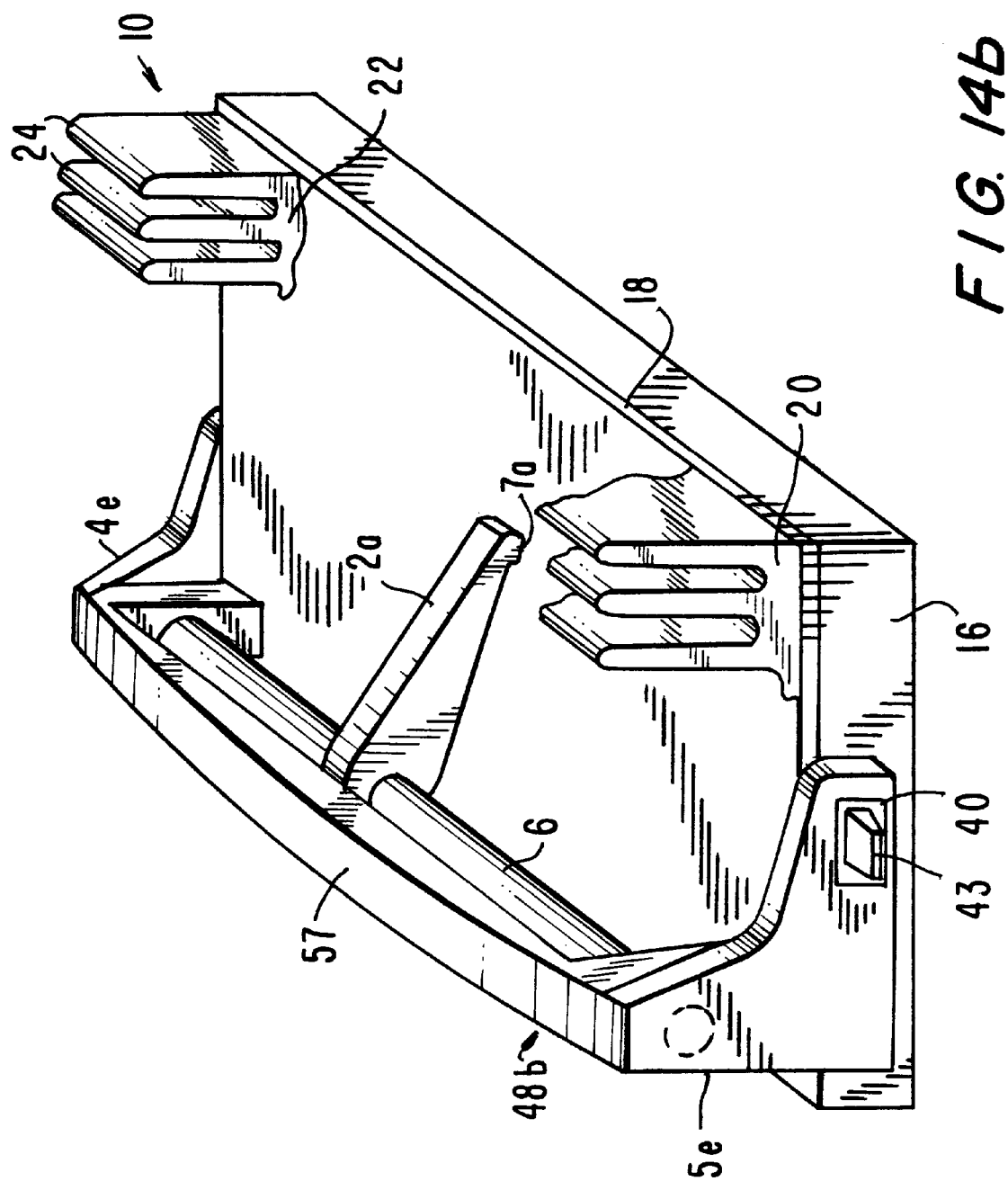
FIG. 14b is an isometric view of still another embodiment
Figure 16:
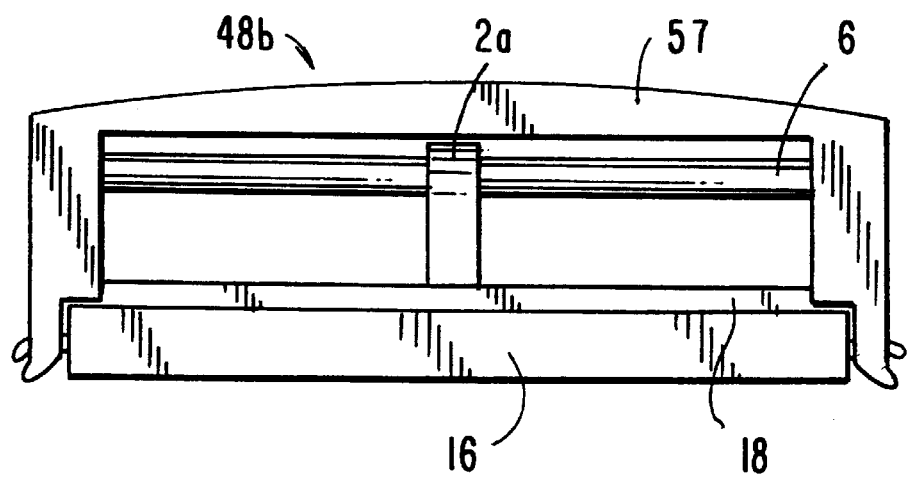
FIG. 16 is a rear view of the embodiment of FIG. 14b.

Referring now to FIGS. 14b and 16, an alternate embodiment is shown wherein the deflection preventing element takes the form of a beam or cross member 57 extending between mounting legs 4e, 5e, such that it is substantially parallel to bar 6, or at least coextensive with bar 6, and positioned above it to prevent or significantly limit upward deflection of bar 6 by engagement of lever 2a with lower cross member surface 58 when bar 6 is stressed. Some upward deflection may be permitted, as a matter of design choice, as long as sufficient downward pressure is maintained on the heat sink by lever 2a.

It will, of course, be recognized that the inclusion of a deflection preventing element, while primarily directed to single lever embodiments, may be included in any of the embodiments described or taught herein, as a matter of application specific design choice. Additionally, the deflection prevention element need not be implemented solely as described, but may be configured in any number of ways, so long as upward deflection is prevented while permitting rotational stress to be applied to the bar by the lever or levers.

Referring once again to FIG. 15, a top view of the embodiment of FIG. 14a is shown. Torsion bar clamp 14a is mounted on top of base 22 of heat sink 20 such that mounting legs 4e, 5e are engaged with bosses 43 of socket 16 and foot 7a of lever 2a is in contact with base 22 of heat sink 20. Bar 6 of torsion bar 28a extends between the outermost fins 24 of heat sink 20 and lever 2a extends into channel 26a formed by the absence of fins 24 of heat sink 20 such that foot 7a engages heat sink base 22. However, similar results can be achieved by mounting torsion bar 28a such that lever 2a extends between fins 24 and bar 6 extend between channel 26a formed by the absence of fins 24. As guides 48a are so formed as to fit and slide between heat sink fins 24 for retention therebetween, mounting legs 4e, 5e are prevented from rotating with bar 6 as bar 6 is stressed by lever 2a during installation.

In operation, torsion bar clamp 14a is positioned above heat sink 20 such that guides 48a slide between and are retained between confronting surfaces of heat sink fins 24 and foot 7a contacts heat sink base 22. Downward force is then applied to torsion bar clamp 14a such that apertures 40 of mounting legs 4e, 5e engage bosses 43 of socket 16 and foot 7a of lever 2a bears upon base 22 of heat sink 20. Similar to the embodiments described above, in this installed state bar 6 is stressed and exerts a downward force on lever 2a causing foot 7a to exert downward force upon heat sink base 22 while mounting legs 4e, 5e exert an upward force on bosses 43 of socket 16. In this manner heat sink 20 and electronic component package 18 are compressively joined.

In the embodiments discussed above, torsion bar clamp 14 is made entirely from plastic and formed by injection molding. However, any material may be substituted for all or some of the parts of the device, whether metallic or non-metallic, provided that such other material possesses appropriately stable mechanical properties over the sustained stress and temperature levels encountered in applications such as those contemplated and described above. The material should also possess appropriate tensile and shear strengths and appropriate ratios of tensile and shear strengths to flexural and shear moduli, respectively.

Though injection molding is the presently preferred method of manufacture, the invention is obviously amenable to other methods of manufacture well known in the art, such as pressing, stamping, welding, casting and the like. In addition, other types of bars may be used, including metal, non-metal or composite bars having round or non-round cross-sections, and in which the necessary forces are imparted to the bar and/or levers not only by torsion of the bar itself but by coil springs, elastically deformable members, or the like.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A heat sink retaining apparatus for thermally and mechanically coupling a surface of a heat sink to a device requiring assisted cooling, said apparatus comprising:

a biasing member comprising a biasing bar having a longitudinal axis, a first lever connected to said biasing bar at a first position on said biasing bar along said longitudinal axis and radially extending from said longitudinal axis for engagement with said heat sink, and means for mounting said biasing member proximate said device and said heat sink, said means for mounting comprising a support fixedly connected to said biasing bar at a second position on said biasing bar along said longitudinal axis, said first lever stressing said biasing bar by rotating said biasing bar at said first position about said longitudinal axis of said biasing bar relative to said second position as said first lever is brought into an engaged position against said heat sink so as to create a biasing force which biases said first lever against said heat sink when said lever is in said engaged position, wherein said means for mounting said biasing member proximate said device and said heat sink are operatively arranged so as to maintain said first lever in said engaged position such that said biasing force is transferred through said first lever to said heat sink to thermally and mechanically couple said heat sink to said device.

2. The apparatus of claim 1, wherein said mounting means comprises a pair of mounting legs between which said biasing bar longitudinally extends.

3. The apparatus of claim 2, wherein each of said mounting legs further comprises an enlarged portion proximate an upper surface to facilitate application of manual pressure to said mounting means by a user during installation of said apparatus.

4. The apparatus of claim 3, wherein said enlarged portion comprises a thumb tab.

5. The apparatus of claim 2, wherein each of said mounting legs further comprises means, engageable with said heat sink, for guiding said mounting means along a predetermined insertion path during installation of said apparatus.

6. The apparatus according to claim 5, wherein said means for guiding comprises a tab extending from each of said mounting legs for slidable, guided movement between adjacent heat radiating structures of said heat sink.

7. The apparatus of claim 1, further comprising a deflection preventing element for preventing deflection of said biasing bar away from said heat sink as said first lever is brought into said engaged position.

8. The apparatus of claim 7, wherein said deflection preventing element comprises a longitudinally extending stiffening member formed on said biasing bar.

9. The apparatus of claim 7, wherein said deflection preventing element comprises a beam extending between said mounting legs and substantially parallel to said biasing bar.

10. The apparatus of claim 2, wherein said pair of mounting legs are arranged on opposing sides of said first position on said biasing bar.

11. The apparatus of claim 10, wherein said biasing bar is fixedly connected to both mounting legs of said pair of mounting legs.

12. A method for thermally and mechanically coupling a surface of a heat sink to a device requiring assisted cooling, said method comprising the steps of:

(a) positioning a heat sink in a desired contact position on the device requiring cooling;

(b) orienting a biasing member comprising a biasing bar having a longitudinal axis and a lever radially extending from a first position on the longitudinal axis for engagement with the heat sink;

(c) mounting the biasing member proximate the heat sink and the device such that the lever is placed in an engaged position against the heat sink and stresses the biasing bar by rotating the biasing bar at the first position about the longitudinal axis relative to a second position of the biasing bar along the longitudinal axis; and (d) maintaining the lever in the engaged position using a mounting means connected to the biasing bar at the second position of the biasing bar so that the stress placed upon the bias bar creates a biasing force which is applied to the heat sink via the lever for retaining the heat sink against the device for mechanical and thermal coupling therebetween.

\* \* \* \* \*